United States Patent [19]
Beauchamp et al.

[11] Patent Number: 5,564,090
[45] Date of Patent: Oct. 8, 1996

[54] METHOD AND APPARATUS FOR DYNAMICALLY ADJUSTING RECEIVER SQUELCH THRESHOLD

[75] Inventors: Bruce A. Beauchamp; James C. Beffa, both of Sunnyvale, Calif.

[73] Assignee: Lockheed Martin IMS Corporation, Teaneck, N.J.

[21] Appl. No.: 335,514

[22] Filed: Nov. 7, 1994

Related U.S. Application Data

[63] Continuation of Ser. No. 119,786, Sep. 9, 1993, abandoned.
[51] Int. Cl.$^6$ ........................................... H04B 1/10
[52] U.S. Cl. .................... 455/220; 455/222; 375/351
[58] Field of Search ................................ 455/218, 220, 455/221, 222, 223, 224, 212, 194.1; 375/104, 351

[56] References Cited

U.S. PATENT DOCUMENTS

| | | |
|---|---|---|
| 3,851,253 | 11/1974 | Eastmond ............................ 455/220 |
| 4,411,021 | 10/1983 | Yoakum ............................... 455/222 |
| 4,430,742 | 2/1984 | Milleker et al. ......................... 375/5 |
| 4,718,115 | 1/1988 | Inoue .................................. 455/218 |
| 5,020,141 | 5/1991 | Meszko ............................... 455/166 |
| 5,161,185 | 11/1992 | Hochschild ........................... 379/416 |

Primary Examiner—Edward F. Urban
Attorney, Agent, or Firm—Townsend and Townsend and Crew

[57] ABSTRACT

An adaptive digital squelch system, responsive to ambient RF background noise, that automatically adjusts the receiver squelch level during intervals when no valid signal is being received. A valid signal is considered to be a signal that is greater than the receiver squelch level and which contains an audio signal at a specific frequency; otherwise, the signal is considered noise. When the invention detects the absence of a valid signal, the squelch level is periodically calculated by averaging multiple noise signal levels at multiple frequencies.

13 Claims, 2 Drawing Sheets

METHOD AND APPARATUS FOR DYNAMICALLY ADJUSTING RECEIVER SQUELCH THRESHOLD

This is a Continuation of application Ser. No. 08/119,786, filed Sep. 9, 1993, now abandoned.

BACKGROUND OF THE INVENTION

The present invention relates generally to radio frequency (RF) communication systems and more specifically to automatically adaptive digital RF squelch systems.

Squelch systems in the prior art have relied on either a fixed squelch or a manually adjustable squelch. With either type of squelch, two types of errors may occur. If the squelch is set too high, valid signals that contain information otherwise capable of being received by the receiver may not be detected. If the squelch level is set too low, ambient RF background noise will be received by the receiver and mistaken for valid signals. For manually-adjustable systems, an operator must make adjustments to the squelch to optimize the squelch level for a particular RF noise environment. These errors are particularly harmful for equipment used in motor vehicles, where ignition and other noise sources make appropriate squelch levels difficult to predict.

Automatic threshold squelch techniques are known wherein a stored detected noise signal is compared to a current detected noise signal to control a squelch gate. An analog noise detector in the form of an analog integrator is disclosed for example in U.S. Pat. No. 4,411,021 issued to J. H. Yoakum of Motorola. Analog noise detection of the type shown is inherently inflexible as it utilizes high pass filters to isolate noise and the squelch level is set according to signals and noise at the audio signal level.

Squelch systems are also known wherein a set noise reference level is compared to a current intermediate frequency (IF) signal to produce a squelch signal. A squelch system of this type is disclosed for example in U.S. Pat. No. 4,718,115 issued to T. Inoue of NEC Corporation. Squelch signal control of the type shown is also inflexible as it does not adjust the receiver squelch level according to changes in the ambient RF background noise and it is responsive only to noise within the signal frequency range.

Thus, there is a need for an adaptive squelch that sets the receiver squelch level automatically according to changes in the ambient RF background noise environment over a broad frequency range.

SUMMARY OF THE INVENTION

The present invention provides a method and apparatus for detecting the absence of a valid signal and, during intervals when no such signal is being received, automatically setting the RF receiver squelch level according to changes in the ambient RF background noise environment. The invention sets the receiver squelch level according to RF signal levels as opposed to audio signal levels. The invention measures ambient RF noise at multiple frequencies in the absence of a valid signal and uses knowledge of this ambient noise to set the receiver squelch level. When valid signals are being received, the present invention ceases squelch level calculations and resumes calculations after no valid signal has been received for a specific time period.

The present invention determines that an RF signal is a valid signal if its strength (amplitude) is greater than the receiver squelch level; otherwise, it is considered noise. The receiver squelch level is calculated by integrating multiple noise signals to produce an average noise strength level which produces the receiver squelch threshold. In one embodiment, an otherwise valid signal is considered noise if the audio signal is not at a specific frequency. Such a noise signal is also used to calculate the average noise strength level. In a spread spectrum receiver, the multiple noise signals that are integrated to produce an average noise strength level comprise signals at multiple frequencies within the spread spectrum pattern.

A method according to the invention comprises the steps of: determining if a valid signal is being received; monitoring the ambient noise level during intervals when no valid signal is being received; periodically adjusting the squelch threshold during the intervals according to changes in the ambient noise level; and disabling squelch in the presence of a valid signal.

A feature of the present invention is that the problems associated with fixed or manually-adjustable squelch systems will be greatly diminished. Such problems include a squelch that is set too high such that valid signals are not recognized and a squelch that is set too low such that ambient noise is recognized as a valid signal.

Another feature of the present invention is that it does not contain a band reject filter to isolate the noise for setting the squelch threshold. Thus, the present invention can be responsive to noise within the signal bandwidth for adjusting the squelch threshold level.

An additional feature of the present invention is that it can work in a very broad range of ambient RF background noise environments.

A further understanding of the nature and advantages of the invention may be realized by reference to the following portions of the specification and drawings.

DESCRIPTION OF THE PREFERRED EMBODIMENT

The present invention works very well in a noise filled environment. In one embodiment, the receiver is located in a motor vehicle where ignition and other noise sources make appropriate squelch levels difficult to predict. In the preferred embodiment, the present invention operates in a system utilizing spread spectrum frequency hopping wherein the transmitter and receiver rapidly "hop" from one frequency to another. The description of the present invention in a spread spectrum frequency hopping receiver is understood not to limit the scope of the invention to that environment. The invention will work equally well in conventional RF environments and one skilled in the art would find it easy to adapt it accordingly.

Figure 1:
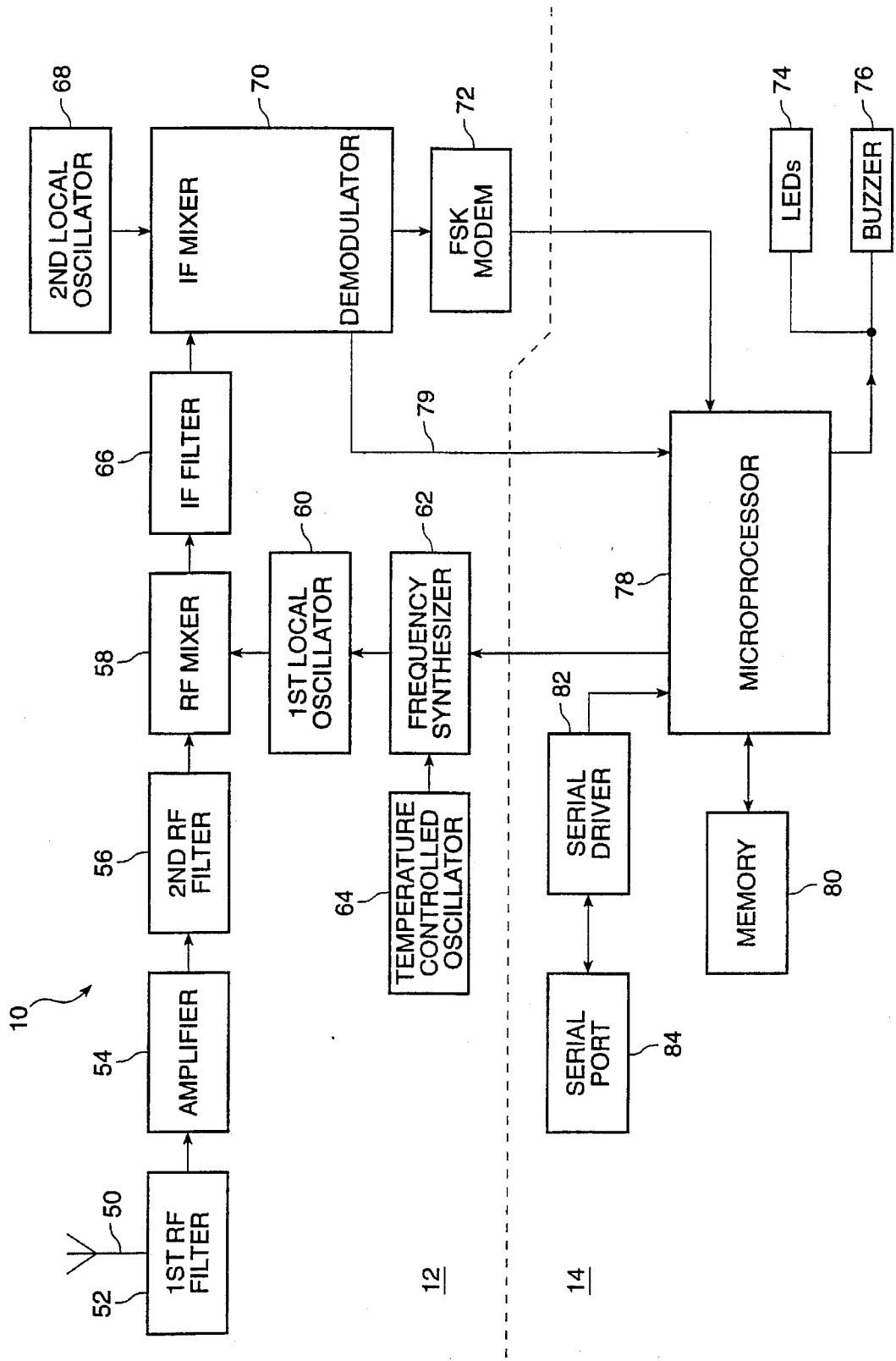
FIG. 1 is a block diagram of an RF receiver incorporating the adaptive digital squelch system of the present invention.

The block diagram of FIG. 1 illustrates a receiver 10 incorporating the present invention. The receiver 10 can be divided into two sections, the RF section 12 and the computer section 14. The receiver 10 as shown is a dual conversion superheterodyne receiver. Interfacing to the outside world is achieved through the RF section 12, a serial port 84, light emitting diodes (LEDs) 74 and a buzzer 76.

Basic control of receiver functions is provided by the computer section 14 which includes microprocessor 78, memory 80, LEDs 74, and buzzer 76.

An RF signal from antenna 50 is passed through first RF filter 52 to help eliminate unwanted out of passband signals, boosted with amplifier 54, and filtered again by second RF filter 56 to produce a filtered RF signal. RF mixer 58 then mixes the filtered RF signal with first local oscillator (LO) 60 controlled by tunable frequency synthesizer 62. Frequency synthesizer 62 is programmed by microprocessor 78; all of the frequencies and their order are stored in a table in memory 80. A temperature controlled crystal oscillator 64 provides a very precise and stable reference for frequency synthesizer 62.

The signal output from mixer 58 is passed through intermediate frequency (IF) filter 66 to reduce unwanted image signals and reduce noise leaving only the desired first intermediate frequency. The filtered IF signal is fed to a combined IF mixer/demodulator 70 which first mixes the signal with second local oscillator 68 and then phase demodulates the signal. The strength of the received RF signal is sent directly to the microprocessor 78 via signal line 79. The signal is demodulated, and the demodulated signal is input to a frequency shift keyed (FSK) modem 72 to produce a serial digital data stream which is in turn routed to microprocessor 78.

Microprocessor 78 with memory 80 executes the adaptive digital squelch algorithm of the present invention. The strength (amplitude) of the received signal and the demodulated signal from IF mixer/demodulator 70 are used by microprocessor 78 to determine the existence of an actual signal and to set the receiver squelch threshold. Serial driver 82 and serial port 84 may be used to communicate with remote devices such as another computer.

In a specific embodiment and referring to FIG. 1, the RF section is a frequency hopping spread spectrum receiver whose spectrum is centered at 915 MHz. The receiver configuration is a dual conversion superheterodyne-type with a first IF at 45 MHz and a second IF at 455 kHz. The computer section 14 comprises an 8-bit 8051-based microcontroller and memory 80 including 32K electronically programmable read only memory (EPROM), 2.25K random access memory (RAM), and 128 bytes of electrically erasable read only memory (EEPROM). The serial port 84 is an RS-232 port.

The RF signal from the antenna 50 is routed through coaxial cable into the receiver 10 via a TNC connector. Filter 52 is a 915 MHz band pass filter, amplifier 54 is a transistor amplifier (BFG67), and filter 56 is a 915 MHz band pass filter. Mixer 58 is a transistor mixer (BRF93) and it mixes the signal with local oscillator 60. Frequency synthesizer 62 is a Phillips UMA1016 frequency synthesizer which is centered at 960 MHz and provides a 45 MHz mixer product. The first LO is a voltage controlled oscillator offset 45 MHz higher than the incoming signal to provide the 45 MHz first IF. This LO covers the range from 954 MHz to 966 MHz in 63 steps of 185.185 KHz. The frequency synthesizer 62 is programmed by the computer section using a 3-wire type interface; all of the frequencies and their order are stored in a table in memory 80. The UMA1016 contains counters and a phase detector circuit so only four external components are needed to complete a phase locked loop (PLL) circuit. Temperature controlled oscillator 64 is at 5 MHz which provides a very precise and stable reference for the frequency synthesizer.

The 45 MHz signal output from RF mixer 58 is passed through IF filter 66 which is a 45 MHz crystal filter. IF mixer/demodulator 70 is a Phillips NE625 frequency modulation (FM) receiver chip. This chip is a nearly complete FM receiver and demodulator, requiring only a handful of external components to complete the receiver function. Since the NE625 contains a mixer, a second oscillator 68 is required, in this case it is provided by a precision crystal at 44.545 MHz, a few capacitors and an inductor. The mixing product of interest is 455 KHz second IF. The NE625 also contains an IF amp and a limiter. The signal is filtered after the mixer by a 455 KHz ceramic filter and then passed into the IF amp. After the IF amp, the signal is filtered again by another 455 KHz filter and fed into the limiter. The output of the limiter is passed through a quadrature tank circuit (an inductor and capacitor) and then back into the NE625 demodulator section. The outputs of the NE625 comprise an amplitude signal strength indicator (RSSI) and the demodulated signal. The analog RSSI signal is sent directly to microprocessor 78. This analog signal is examined by microprocessor 78 with one of its analog-to-digital (A/D) inputs. The demodulated signal is input to a frequency shift keyed (FSK) modem, which is an Exar XR-2211. The outputs of this chip comprise a serial digital data stream which is routed to the microcontroller through some control logic and a carrier detect signal.

Microprocessor 78 and memory 80 consist of four chips: a Phillips 80C552 microcontroller, a WSI PSD-311 multi-function peripheral chip, Microchip 24C01 serial EEPROM chip, and a 74HC125 tristate quad buffer. The computer section also contains a Maxim MAX232 RS-232 driver chip, four LEDs and a buzzer. The PSD-311 contains 32K bytes of EPROM which is used to store the program plus 2K bytes of RAM used for computational workspace. An additional 256 bytes of RAM workspace are provided by the 80C552. The PSD-311 is also used to drive the LEDs and buzzer. Storage of information, such as a vehicle identification number as in the preferred embodiment, is placed in the EEPROM for nonvolatile retention. The primary communication to the microcontroller link is through the 80C552's serial port. The serial port is used to program the frequency synthesizer, decode the incoming data from the RF link, and to communicate with the on-board computer or expansion device through the serial port 84, which is an RS-232 port. The microprocessor controls these functions by using the 74HC125 logic chip.

Figure 2:
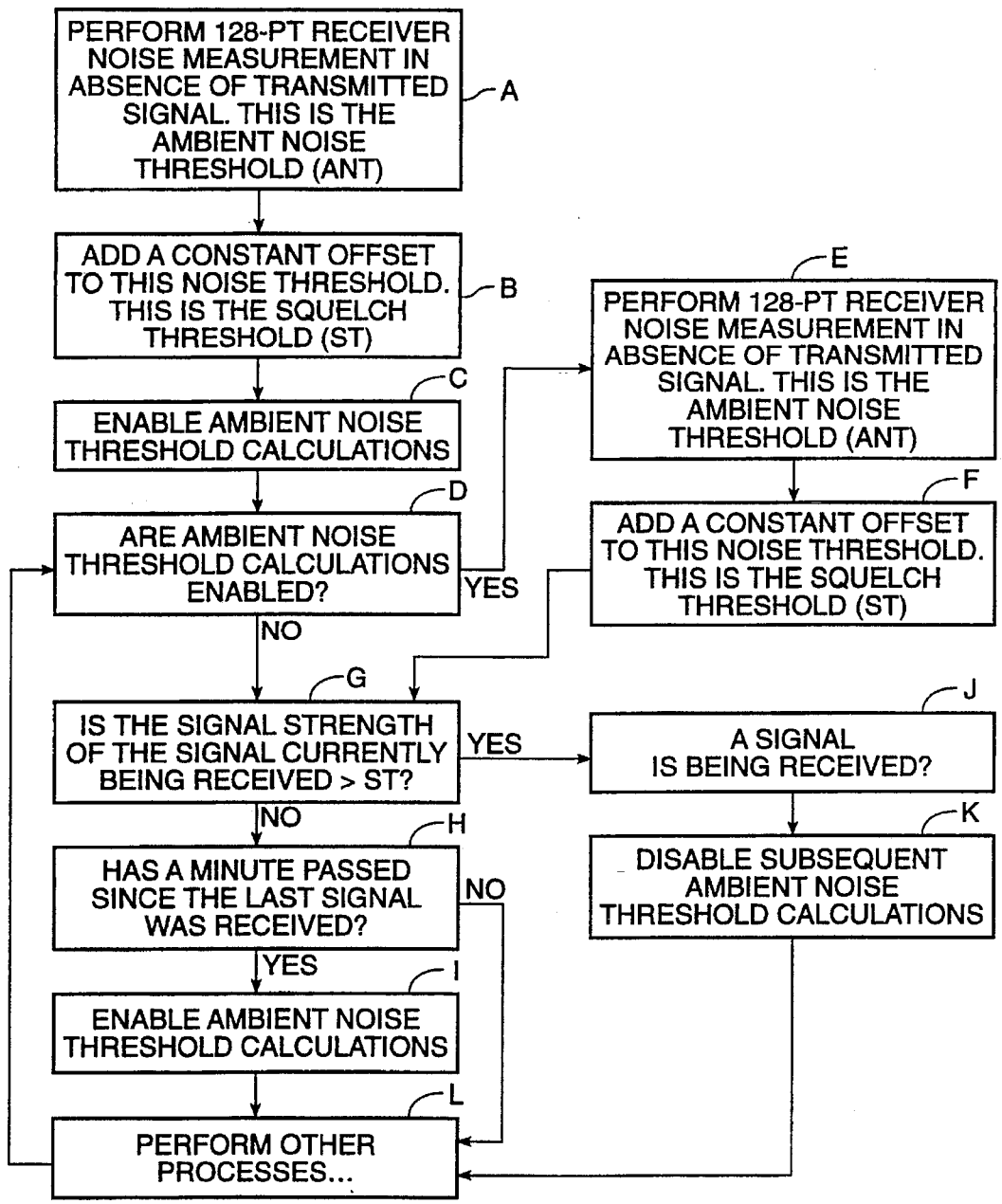
FIG. 2 is a flow chart of the adaptive digital squelch algorithm of the present invention.

FIG. 2 is a flow chart of the adaptive squelch algorithm of the present invention. Initially a 128 point receiver noise measurement is performed in the absence of a valid signal at least one frequency (Step A). A 128 point receiver noise measurement consists of the processor recording 128 separate RF noise measurements and integrating them together to produce an average noise strength level across the entire passband of the received signal. In the spread spectrum system of the preferred embodiment, this is initially done at power-up by taking 128 RF signal measurements at a frequency that is not expected to be used for a valid signal for any extended period, such as a frequency which is not licensed for fixed frequency broadcasting. As there is a high probability that there will be no valid signals present at power-up, all signals are assumed to be noise. In a conventional RF system, obtaining an initial noise measurement may be done by any number of ways known to those skilled the art such as providing a suitable startup value or tuning a synthesizer to a known unused frequency.

The average so obtained is the initial ambient noise threshold (ANT). Since the ANT is an average of noise signals, some signals above the ANT were noise. Therefore, the squelch threshold (ST) that is used to determine if a certain signal is a valid signal should be somewhat higher than the ANT. Thus, a constant is added to the ANT to produce the ST (Step B). This constant may be obtained by experimentation but in the preferred embodiment it is approximately 4% of the A/D converter's dynamic range. The ST is the strength level that a signal must exceed in order to be considered a valid signal. Next, ambient noise threshold calculations are enabled (Step C). Enablement can be done by setting a flag or any of a number of ways known to those skilled in the art.

A test is then performed to determine if ambient noise threshold calculations are enabled (Step D). If they are enabled then the ST is calculated again. Since the receiver is then operating, the ANT must be calculated differently. During receiver operation, the most recent 128 RF noise signals (i.e., not valid) are stored. These 128 noise signals are integrated together to produce an average noise strength level (Step E). In the spread spectrum system of the preferred embodiment, the 128 noise signals will comprise noise signals sampled at multiple frequencies in the receiver's "hopping" pattern. (In a conventional RF system, the multiple noise signals could consist of any combination of frequencies within and outside the signal frequency range.) A constant is then added to the ANT as above to produce the new ST (Step F).

The strength (amplitude) of the signal being received is then compared to the ST (Step G). If the signal level is greater than the ST, a valid signal is assumed to be received (Step J) and ambient noise threshold calculations are disabled (Step K) so that the ST will not be recalculated while the valid signal is being received. In the preferred embodiment, a valid signal must have a specific audio frequency. Thus, the audio signal can be analyzed easily to further determine if the received signal is valid information or noise. If analysis of the audio signal indicates that the received signal does not contain valid information, then it is considered a noise signal and will be integrated with other noise signals to produce the ANT. Other embodiments could analyze the audio signal for content or for various other characteristics.

If the signal is not greater than the ST, a valid signal is not being received and the signal representing noise is not relayed to be output. A test based on the measurement of a clock is then performed to see if a minute or other appropriate interval has elapsed since the last valid signal was received (Step H). If a minute has elapsed, ambient noise threshold calculations are enabled (Step I) so that the ST can be periodically recalculated during the interval when no valid signal is being received.

While the above is a complete description of the preferred embodiment of the invention, various alternatives, modifications, and equivalents may be used. Therefore, the above description should not be taken as limiting the scope of the invention as defined by the appended claims.

What is claimed is:

1. An adaptive digital squelch which dynamically changes a receiver squelch threshold when no valid signal is being received, comprising:

means for receiving a radio frequency signal;

demodulating means, coupled to said signal receiving means, for converting said radio frequency signal to a demodulated signal;

measuring means, coupled to said signal receiving means, for measuring a radio frequency signal strength of said radio frequency signal; and processor means, coupled to said demodulating means and said measuring means, comprising means for 1) determining if said demodulated signal is a valid signal using said radio frequency signal strength measurement and thereupon disabling squelch, for 2) monitoring said radio frequency signal strength measurement during intervals when no valid signal is being received to determine an ambient RF background noise level, and for 3) adjusting the receiver squelch threshold responsive to changes in the ambient RF background noise level by integrating a plurality of noise signal measurements at a plurality of frequencies of the radio frequency signal to produce an average noise signal strength, a noise signal measurement being defined as a radio frequency signal strength measurement that is less than the receiver squelch threshold.

2. The adaptive digital squelch of claim 1, wherein the processor means determines that a valid signal is being received if the radio frequency signal strength measurement is greater than the receiver squelch threshold.

3. The adaptive digital squelch of claim 1, wherein a noise signal measurement is further defined as a radio frequency signal strength measurement obtained when the processor means determines the demodulated signal is not a valid signal based on an audio characteristic of the demodulated signal.

4. The adaptive digital squelch of claim 1, wherein the processor means adds a constant to the noise signal average to obtain the receiver squelch threshold.

5. A method of automatically adjusting a receiver squelch threshold in a receiver, comprising the steps of:

receiving a radio frequency signal;

converting said radio frequency signal to a demodulated signal and a radio frequency signal strength measurement;

measuring a radio frequency signal strength of said radio frequency signal to obtain a radio frequency signal strength measurement;

using a processor to determine if said radio frequency signal strength measurement is greater than the receiver squelch threshold, indicative of a valid signal;

using the processor to periodically adjust the receiver squelch threshold during intervals in which no valid signal is being received according to changes in ambient RF background noise by integrating a plurality of noise signal measurements obtained at a plurality of frequencies to produce an average noise signal measurement, a noise signal measurement being defined as a radio frequency signal strength measurement that is less than the receiver squelch threshold; and using the processor to disable squelch in the presence of a valid signal.

6. The method of claim 5, wherein a noise measurement is further defined as a radio frequency signal strength measurement obtained during a period when the processor determines the demodulated signal is not a valid signal based on an audio characteristic of the demodulated signal.

7. The method of claim 5, wherein the processor sets the receiver squelch threshold by adding a constant to the average noise signal measurement.

8. A method of automatically adjusting a receiver squelch threshold when no valid signal is being received, a valid signal being a signal that has a signal strength greater than the receiver squelch threshold, comprising the steps of:

(a) obtaining an initial receiver squelch threshold; thereafter (b) enabling ambient noise threshold calculations;

(c) testing whether ambient noise threshold calculations are enabled and proceeding to step (e) if they are disabled;

(d) adjusting receiver squelch threshold responsive to ambient noise as indicated by the signal strength in the absence of a valid signal;

(e) testing if the signal strength of the signal currently being received is greater than the receiver squelch threshold indicating a valid signal is being received and proceeding to step (g) if a valid signal is not being received; thereafter (f) disabling subsequent ambient noise threshold calculations and proceeding to step (i);

(g) testing whether a specified amount of time has elapsed since the last valid signal was received and proceeding to step (i) if the specified amount of time has not elapsed; thereafter (h) enabling ambient noise threshold calculations; and (i) repeating steps (c) through (i) during receiver operation.

9. The method of claim 8, wherein the adjusting step further comprises integrating a plurality of noise signal measurements to produce an average noise signal strength, a noise signal measurement being defined as a signal strength measurement that is less than the receiver squelch threshold.

10. The method of claim 9, wherein the plurality of noise signal measurements include signal strength measurements obtained at a plurality of frequencies of a received signal.

11. The method of claim 9, wherein a noise signal measurement is further defined as a signal strength measurement obtained when a demodulated signal is not a valid signal because of an audio characteristic in the demodulated signal.

12. The method of claim 9, wherein a constant is added to the measured ambient noise to obtain the receiver squelch threshold.

13. The method of claim 8, wherein the initial receiver squelch threshold is obtained by measuring the ambient noise in the absence of a valid signal.

* * * * *